United States Patent
Shin et al.

(10) Patent No.: US 11,360,518 B2
(45) Date of Patent: Jun. 14, 2022

(54) FLEXIBLE DISPLAY MODULE AND ELECTRONIC DEVICE COMPRISING THE SAME

(71) Applicant: LG Display Co., Ltd., Seoul (KR)

(72) Inventors: Insik Shin, Paju-si (KR); BuHui Lee, Paju-si (KR); SeHwan Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 174 days.

(21) Appl. No.: 16/707,952

(22) Filed: Dec. 9, 2019

(65) Prior Publication Data

US 2020/0192433 A1 Jun. 18, 2020

(30) Foreign Application Priority Data

Dec. 13, 2018 (KR) ........................ 10-2018-0161386

(51) Int. Cl.
| | | |
|---|---|---|
| *G06F 1/16* | (2006.01) | |
| *G06F 1/20* | (2006.01) | |
| *G09F 9/30* | (2006.01) | |

(52) U.S. Cl.
CPC .......... *G06F 1/1652* (2013.01); *G06F 1/1656* (2013.01); *G06F 1/203* (2013.01); *G06F 1/206* (2013.01); *G09F 9/301* (2013.01); *G06F 1/1626* (2013.01)

(58) Field of Classification Search
CPC ...... G06F 1/1652; G06F 1/1656; G06F 1/206; G06F 1/203
See application file for complete search history.

(56) References Cited

U.S. PATENT DOCUMENTS

| | | | | |
|---|---|---|---|---|
| 9,349,969 | B2* | 5/2016 | Kwon | H01L 51/0097 |
| 9,490,312 | B2* | 11/2016 | Lee | H01L 27/3276 |
| 2013/0002133 | A1* | 1/2013 | Jin | H01L 51/0097 |
| | | | | 313/511 |
| 2016/0062516 | A1* | 3/2016 | Jeong | G06F 1/1643 |
| | | | | 345/174 |
| 2016/0093685 | A1* | 3/2016 | Kwon | H01L 51/5253 |
| | | | | 257/40 |
| 2018/0284935 | A1* | 10/2018 | Lee | G06F 1/1652 |
| 2019/0339741 | A1* | 11/2019 | Park | H01L 51/5253 |
| 2019/0373719 | A1* | 12/2019 | Lee | H05K 1/0271 |
| 2020/0042131 | A1* | 2/2020 | Lee | G06F 1/1601 |
| 2020/0057472 | A1* | 2/2020 | Kang | H05K 3/388 |
| 2020/0194712 | A1* | 6/2020 | Choi | H01L 51/56 |
| 2020/0196496 | A1* | 6/2020 | Shin | H05K 5/03 |
| 2021/0004101 | A1* | 1/2021 | Wei | G06F 1/1652 |

FOREIGN PATENT DOCUMENTS

KR 10-2016-0125273 A 10/2016

* cited by examiner

*Primary Examiner* — Nidhi Thaker
(74) *Attorney, Agent, or Firm* — Birch, Stewart, Kolasch & Birch, LLP

(57) ABSTRACT

A flexible display module and an electronic device including the flexible display module are disclosed, flexible display panel including a display portion, a display pad portion and a panel bending portion between the display portion and the display pad portion; a display driving circuit portion disposed at a rear surface of the flexible display panel and configured to include a driving integrated circuit connected with the display pad portion; and a shield member configured to cover the display driving circuit portion at the rear surface of the flexible display panel and configured to have a shock absorbing portion overlapped with the driving integrated circuit.

20 Claims, 4 Drawing Sheets

FLEXIBLE DISPLAY MODULE AND ELECTRONIC DEVICE COMPRISING THE SAME

CROSS-REFERENCE TO RELATED APPLICATIONS

This application claims the priority benefit of the Korean Patent Application No. 10-2018-0161386 filed in the Republic of Korea on Dec. 13, 2018, the disclosure of which is hereby incorporated by reference in its entirety as if fully set forth herein.

BACKGROUND

Technical Field

The present disclosure relates to a flexible display module and an electronic device comprising the same.

Discussion of the Related Art

Generally, an electronic device with a display such as a television, a monitor, a notebook computer, a smart phone, a tablet computer, an electronic pad, a wearable device, a watch phone, a mobile information device, a navigation, or a vehicle control display device can be realized in a multimedia player having complex function of an image displaying function, photo shooting function or video recording function, audio or video file playing function, game, or broadcasting receiving functions.

The electronic device can include a housing, a flexible display module configured to include a flexible display panel and accommodated in the housing, a panel flexible circuit film connected with the flexible display panel and provided with a driving integrated circuit mounted thereon, and a cover window configured to cover the flexible display module. The flexible display panel can include a bending portion which is bent to reduce a bezel width of the electronic device. The panel flexible circuit film is disposed at a rear surface of the flexible display module, and can be electrically connected with a pad portion prepared in the bending portion of the flexible display panel.

However, in case of the general electronic device, the driving integrated circuit can be damaged due to a physical contact between the driving integrated circuit and structures in accordance with a vibration and external shock. Also, in case of the general electronic device, the flexible display panel and the driving circuit can be damaged due to externally-introduced static electricity.

SUMMARY

The present disclosure has been made in view of the above problems, and it is an object of the present disclosure to provide a flexible display module capable of preventing or reducing a damage of a driving integrated circuit, and an electronic device comprising the same.

In accordance with an aspect of the present disclosure, the above and other objects can be accomplished by the provision of a flexible display module including a flexible display panel including a display portion, a panel bending portion and a display pad portion; a display driving circuit portion disposed at a rear surface of the flexible display panel and configured to include a driving integrated circuit connected with the display pad portion; and a shield member configured to cover the display driving circuit portion at the rear surface of the flexible display panel and configured to have a shock absorbing portion overlapped with the driving integrated circuit.

In accordance with another aspect of the present disclosure, there is provided an electronic device including a flexible display module combined with a cover window; and a housing configured to support the cover window and to accommodate the flexible display module, wherein the flexible display module comprises a flexible display panel including a display portion, a panel bending portion and a display pad portion; a display driving circuit portion disposed at a rear surface of the flexible display panel and configured to include a driving integrated circuit connected with the display pad portion; and a shield member configured to cover the display driving circuit portion at the rear surface of the flexible display panel and configured to have a shock absorbing portion overlapped with the driving integrated circuit.

In accordance with another aspect of the present disclosure, there is provided an electronic device including a flexible display module combined with a cover window; and a housing configured to support the cover window and to accommodate the flexible display module, wherein the flexible display module includes a flexible display panel including a display portion, a panel bending portion and a display pad portion; a conductive heat dissipating portion combined with a rear surface of the flexible display panel; a panel flexible circuit film disposed at the rear surface of the flexible display panel and connected with the display pad portion; a driving integrated circuit mounted on the panel flexible circuit film; a flexible circuit board connected with the panel flexible circuit film; and a shield member configured to cover the display pad portion, the driving integrated circuit and some of the flexible circuit board at the rear surface of the flexible display panel, and attached to the conductive heat dissipating portion, wherein the shield member includes a shock absorbing portion overlapped with the driving integrated circuit.

According to one or more embodiments of the present disclosure, it is possible to prevent or reduce the driving integrated circuit from being damaged by a physical contact between the driving integrated circuit and structures in accordance with a vibration and external shock.

According to one or more embodiments of the present disclosure, it is possible to minimize or prevent the flexible display panel from being damaged by static electricity.

In addition to the objects of the present disclosure as mentioned above, additional objects of the present disclosure will be clearly understood by those skilled in the art from the following description of the present disclosure.

BRIEF DESCRIPTION OF THE DRAWINGS

The accompanying drawings, that can be included to provide a further understanding of the disclosure and are incorporated in and constitute a part of this application, illustrate embodiments of the disclosure and together with the description serve to explain various principles of the disclosure.

DETAILED DESCRIPTION OF THE EMBODIMENTS

Figure 1:
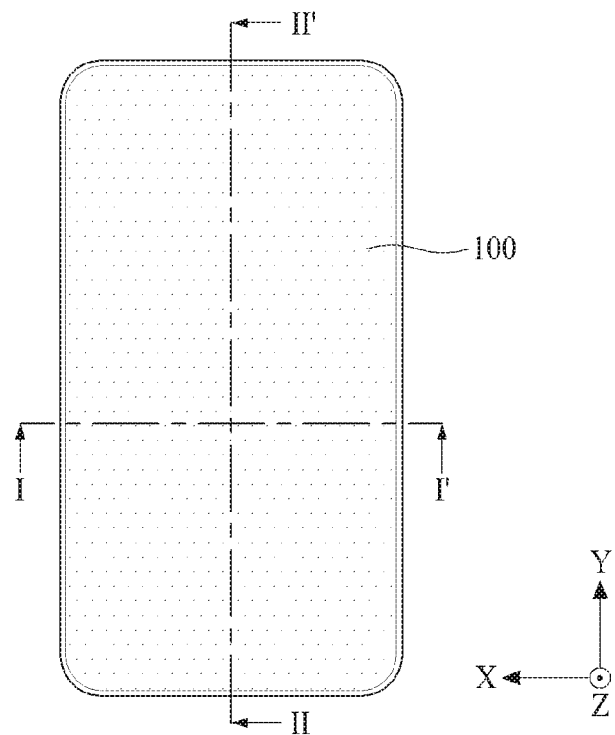
FIG. 1 is a plane view illustrating an electronic device according to one embodiment of the present disclosure.

Advantages and features of the present disclosure, and implementation methods thereof will be clarified through following embodiments described with reference to the accompanying drawings. The present disclosure can, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part can be added unless 'only-' is used. The terms of a singular form can include plural forms unless referred to the contrary.

In construing an element, the element is construed as including an error range although there is no explicit description.

In describing a position relationship, for example, when the position relationship is described as 'upon-', 'above-', 'below-' and 'next to-', one or more portions can be arranged between two other portions unless 'just' or 'direct' is used.

It will be understood that, although the terms "first", "second", etc. can be used herein to describe various elements, these elements should not be limited by these terms. These terms are only used to distinguish one element from another. For example, a first element could be termed a second element, and, similarly, a second element could be termed a first element, without departing from the scope of the present disclosure.

It should be understood that the term "at least one" includes all combinations related with any one item. For example, "at least one among a first element, a second element and a third element" can include all combinations of two or more elements selected from the first, second and third elements as well as each element of the first, second and third elements.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in a co-dependent relationship.

Hereinafter, a flexible display module and an electronic device including the same according to the embodiments of the present disclosure will be described in detail with reference to the accompanying drawings. In the specification, in adding reference numerals for elements in each drawing, it should be noted that like reference numerals already used to denote like elements in other drawings are used for elements wherever possible. In the following description, when the detailed description of the relevant known function or configuration is determined to unnecessarily obscure the important point of the present disclosure, the detailed description will be omitted.

Figure 2:
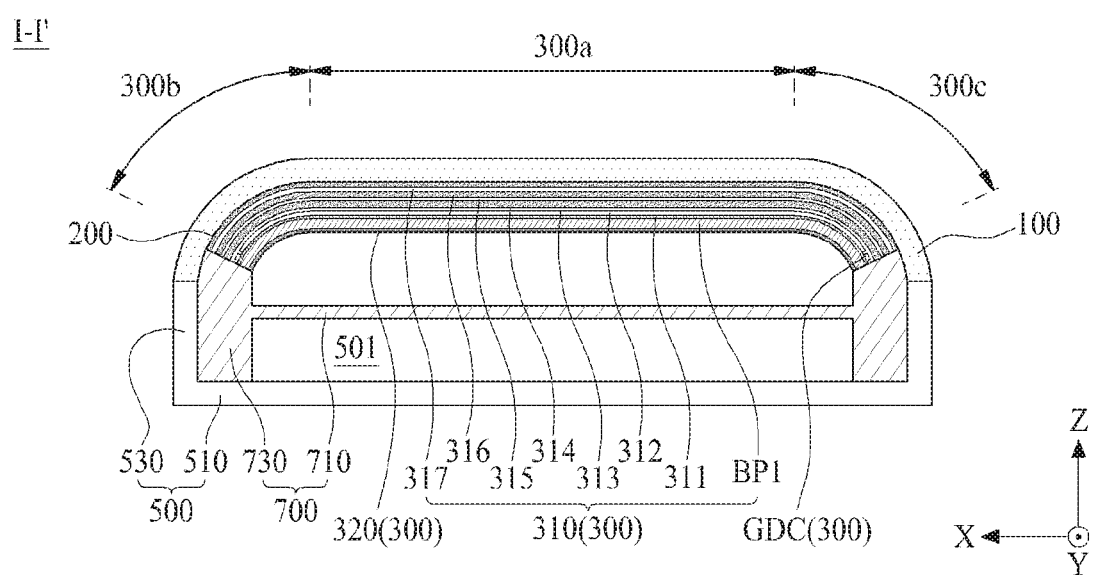
FIG. 2 is a cross-sectional view taken along line I-I' of FIG. 1.
Figure 3:
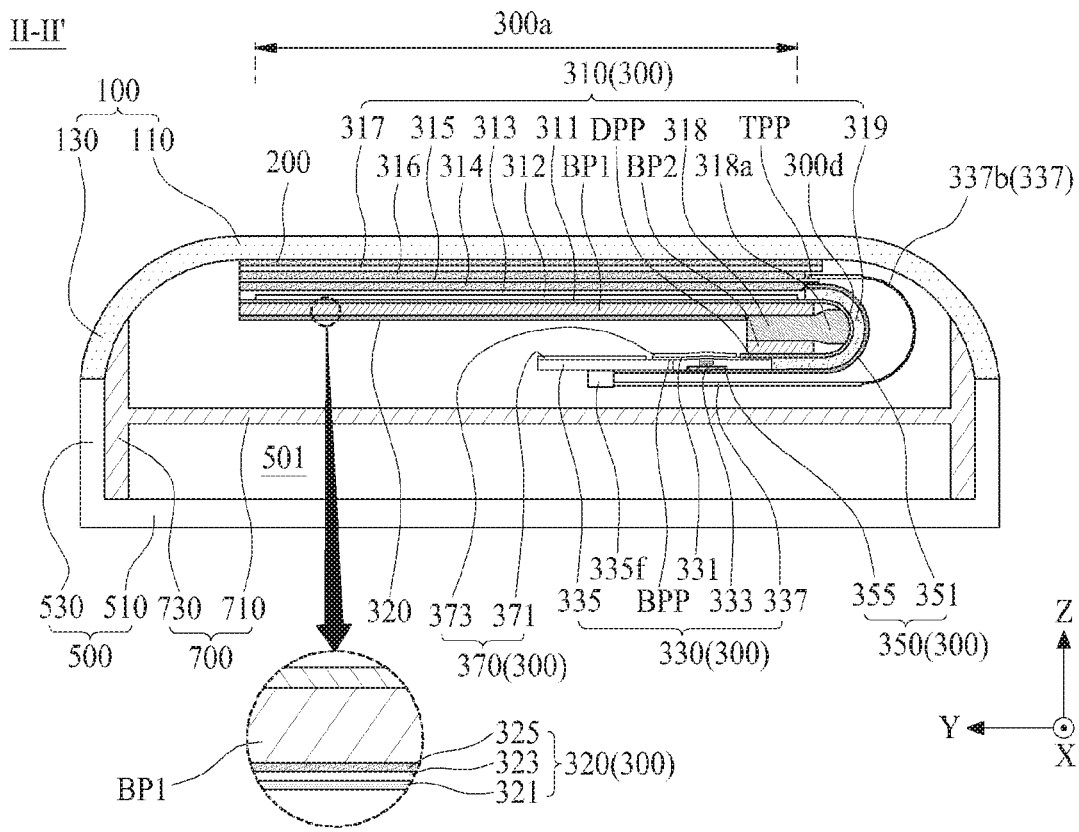
FIG. 3 is a cross-sectional view taken along line II-IT of FIG. 1.
Figure 4:
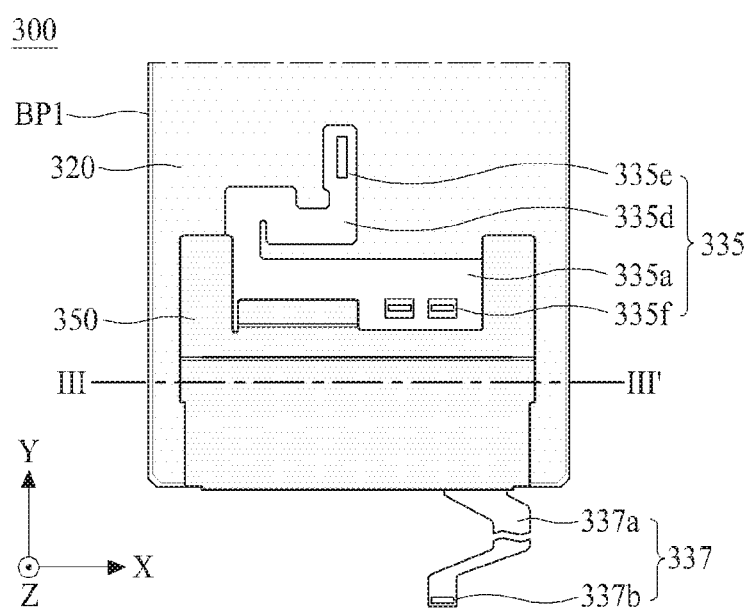
FIG. 4 illustrates a rear surface of a flexible display module shown in FIG. 3.
Figure 5:
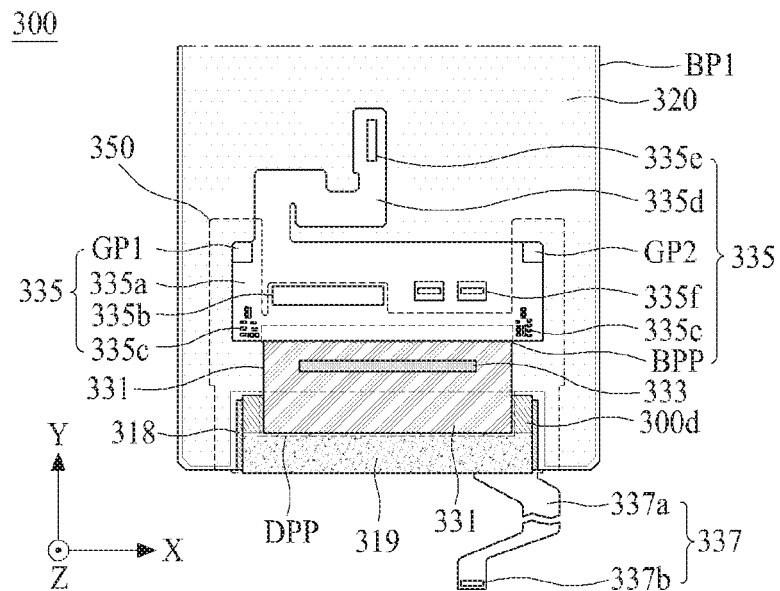
FIG. 5 illustrates a flexible display module obtained by removing a shield member from the rear surface of the flexible display module of FIG. 4.

FIG. 1 is a plane view illustrating an electronic device according to one embodiment of the present disclosure. FIG. 2 is a cross-sectional view taken along line I-I' of FIG. 1. FIG. 3 is a cross-sectional view taken along line II-IT of FIG. 1. FIG. 4 illustrates a rear surface of a flexible display module shown in FIG. 3. FIG. 5 illustrates a flexible display module obtained by removing a shield member from a rear surface of the flexible display module of FIG. 4. All the components of the electronic device according to all embodiments of the present disclosure are operatively coupled and configured.

Referring to FIGS. 1 to 5, the electronic device according to one embodiment of the present disclosure can include a cover window 100, a flexible display module 300, and a housing 500. Herein, a scale in each of the cover window 100, the flexible display module 300, and the housing shown in FIGS. 1 to 5 can be different from a real scale, for convenience of explanation, whereby it is not limited to the scale shown in the drawings.

The cover window 100 covers front and lateral surfaces of the flexible display module 300, whereby the cover window 100 protects the flexible display module 300 from an external shock.

The cover window 100 according to one embodiment of the present disclosure can be formed of a transparent plastic material, a glass material, or a tempered glass material. For example, the cover window 100 can be formed of sapphire glass or gorilla glass, or can be formed in a deposition structure of sapphire glass and gorilla glass. According to another example, the cover window 100 can include any one material among PET(polyethyleneterephthalate), PC(polycarbonate), PES(polyethersulfone), PEN(polyethylenapthanate), and PNB(polynorborneen). In consideration of scratch and transparency, the cover window 100 can be formed of tempered glass.

The cover window 100 according to one embodiment of the present disclosure can include a front portion 110 and a sidewall portion 130.

The front portion 110 corresponds to a central portion of the cover window 100, wherein the front portion 110 can be a transparent portion through which light passes. The front portion 110 can have a whole flat shape. The front portion 110 can be expressed as a front window.

The sidewall portion 130 can be bent in a curved-line shape with a predetermined radius of curvature from the edge of the front portion 110. For example, the sidewall portion 130 can include a first sidewall which is bent from the first edge (or left edge) of the front portion 110, a second sidewall which is bent from the second edge (or right edge) of the front portion 110, a third sidewall which is bent from the third edge (or upper edge) of the front portion 110, a fourth sidewall which is bent from the fourth edge (or lower edge) of the front portion 110, and a rounding portion connected between each of the first to fourth sidewalls. Accordingly, each edge of the front portion 110 can have a wholly-curved structure by the sidewall portion 130. The sidewall portion 130 can be expressed as a lateral window or lateral curved window.

According to the cover window 100 being a wholly-curved 4-side bending structure, it is possible to realize a good design in the electronic device, and to reduce a bezel width in each of horizontal and vertical directions of the electronic device.

Additionally, the cover window 100 can further include a design layer (or decoration layer) prepared in the edge. The design layer is printed at least one time on the edge of a rear surface (or back surface) of the cover window 100 confronting the flexible display module 300 so that it is possible to cover a non-display area on which an image is not displayed in the electronic device.

Selectively, the cover window 100 according to one embodiment of the present disclosure can be formed in a plate shape comprising only the front portion 110. In this case, the aforementioned sidewall portion 130 is omitted.

The flexible display module 300 can be a flexible display module of a flat display device. For the following description of the present disclosure, it is assumed that the flexible display module 300 is a flexible light emitting display module.

The flexible display module 300 can be connected with the rear surface (or back surface) of the cover window 100 so that it is possible to display an image or to sense a user's touch. The flexible display module 300 can be bonded to a rear surface of the front portion 110 of the cover window 100 by a direct bonding process using a module bonding member 200. Herein, the module bending member 200 can include pressure sensitive adhesive (PSA), optically clear adhesive (OCA), or optically clear resin (OCR). The module bonding member 200 can be expressed or referred to as a transparent adhesive member.

The flexible display module 300 according to one embodiment of the present disclosure can include a display portion 300a, a first bending display portion 300b, and a second bending display portion 300c.

The display portion 300a can be configured to display an image on the front portion 110 of the cover window 100. The first bending display portion 300b, which is bent in shape of curved surface from the first edge of the display portion 300a, enables to display an image on the curved surface of the first sidewall in the sidewall portion 130 of the cover window 100. The second bending display portion 300c, which is bent in shape of curved surface from the second edge of the display portion 300a, enables to display an image on the curved surface of the second sidewall in the sidewall portion 130 of the cover window 100. Selectively, it is possible to omit the first bending display portion 300b and the second bending display portion 300c. In this case, the display portion 300a of the flexible display module 300 is overlapped with the front portion 110 of the cover window 100, however, can be not overlapped with the sidewall portion 130.

The flexible display module 300 according to one embodiment of the present disclosure can include a flexible display panel 310 including the display portion 300a, a panel bending portion 300d and a display pad portion (DPP), a display driving circuit portion 330 disposed in (or at) a rear surface of the flexible display panel 310 and configured to include a driving integrated circuit 333 connected with the display pad portion DPP, and a shield member 350 configured to cover the display driving circuit portion 330 in (or at) the rear surface of the flexible display panel 310 and configured to have a shock absorbing portion 355 overlapped with the driving integrated circuit 333.

The flexible display panel 310 can display an image on each of the display portion 300a, the first bending display portion 300b, and the second bending display portion 300c, or can display an image only on the display portion 300a. The flexible display panel 310 according to one embodiment of the present disclosure can include a flexible substrate 311, a pixel array 312, a gate driving circuit GDC, the display pad portion DPP, an encapsulation portion 313, a touch electrode portion 315, a touch pad portion TPP, a functional film 317, a first back plate BP1, a second back plate BP2, and a bending maintenance member 318.

The flexible substrate 311 can be defined as a base substrate of the flexible display panel 310. The flexible substrate 311 according to one embodiment of the present disclosure can include a plastic material with flexibility, for example, opaque or colored polyimide (PI). The flexible substrate 311 according to another embodiment of the present disclosure can be formed in a thin film of a glass material having flexibility.

The pixel array 312 according to one embodiment of the present disclosure is formed on the display portion 300a, the first bending display portion 300b, the second bending display portion 300c defined in the flexible substrate 311, whereby an image can be displayed on each of the display portion 300a, the first bending display portion 300b, and the second bending display portion 300c.

The pixel array 312 can include a plurality of pixels which are prepared in a pixel area defined by signal lines on the flexible substrate 311, and are configured to display an image in accordance with a signal supplied to the signal lines. The signal lines can include a gate line, a data line, and a pixel driving power source line.

Each of the plurality of pixels can include a pixel circuit layer comprising a driving thin film transistor prepared in the pixel area, an anode electrode electrically connected with the driving thin film transistor, an emission device layer formed on the anode electrode, and a cathode electrode electrically connected with the emission device layer.

The driving thin film transistor is prepared in a transistor area of each pixel area defined on the flexible substrate 311, and the driving thin film transistor can include a gate electrode, a gate insulating film, a semiconductor layer, a source electrode, and a drain electrode. Herein, the semiconductor layer of the thin film transistor can include silicon of a-Si, poly-Si, or low-temperature poly-si, or can include an oxide such as Indium-Gallium-Zinc-Oxide (IGZO).

The anode electrode is prepared as a pattern shape in an opening area defined in each pixel area, and is electrically connected with the driving thin film transistor.

The emission device layer according to one embodiment of the present disclosure can include an organic light emitting device formed on the anode electrode. The organic light emitting device can be configured to emit the same colored light by each pixel, for example, white colored light by each pixel, or can be configured to emit the different colored light by each pixel, for example, red colored light, green colored light, or blue colored light by each pixel.

The emission device layer according to one embodiment of the present disclosure can include a micro light emitting diode device electrically connected with the anode electrode and the cathode electrode. The micro light emitting diode device can be a light emitting diode realized in an integrated circuit (IC) or chip, wherein the micro light emitting diode device can include a first terminal electrically connected with the anode electrode, and a second terminal electrically connected with the cathode electrode.

The cathode electrode can be connected with an emission device of the emission device layer prepared for each pixel area in common.

The gate driving circuit GDC can be formed in the first edge and/or second edge of the flexible substrate 311 so that the gate driving circuit can be connected with one end and/or the other end in each gate signal line prepared on the flexible substrate 311. The gate driving circuit GDC can generate a gate signal in response to a gate control signal supplied through the display pad portion DPP, and can supply the generated gate signal to each of the plurality of gate lines. The gate driving circuit can be a gate embedded circuit formed for a process of manufacturing the thin film transistor of the pixel, but not limited to this type.

The display pad portion DPP can include a plurality of pad electrodes prepared at one edge (or non-display area at one side) of the flexible substrate 311 which is apart from one side of the pixel array 312. Each of the plurality of pad electrodes can be electrically connected with the gate driving circuit and the signal line of the pixel array 312 through a link line disposed in the panel bending portion 300d between the display pad portion DPP and one side of the pixel array 312.

The encapsulation portion 313 can be formed on the flexible substrate 311 while being configured to surround the pixel array 312 so that it is possible to prevent oxygen or moisture from being permeated into the emission device layer of the pixel array 312. The encapsulation portion 313 according to one embodiment of the present disclosure can be formed in a multi-layered structure obtained by alternately depositing an organic material layer and an inorganic material layer. Herein, the inorganic material layer prevents oxygen or moisture from being permeated into the emission device layer of the pixel array 312. And, the organic material layer can be formed in a relatively large thickness in comparison to the inorganic material layer so that the organic material layer can cover particles which might be generated for a manufacturing process. For example, the encapsulation portion 313 can include a first inorganic film, an organic film on the first inorganic film, and a second inorganic film on the organic film. In this case, the organic film can be defined as a particle cover layer.

The touch electrode portion 315 can be disposed on the encapsulation portion 313, wherein the touch electrode portion 315 serves as a touch sensor capable of sensing a user's touch on the cover window 100.

The touch electrode portion 315 according to one embodiment of the present disclosure can include a touch electrode layer disposed on the encapsulation portion 313 overlapped with the pixel array 312, and a dielectric layer configured to cover the touch electrode layer. Selectively, the touch electrode portion 315 can be provided on a touch buffer layer configured to cover the encapsulation portion 313. For example, the touch electrode layer can include a plurality of touch driving electrodes disposed at fixed intervals on the encapsulation portion 313 overlapped with the pixel array 312, and a plurality of touch sensing electrodes electrically insulated from the touch driving electrodes. The touch sensing electrodes can be disposed in the same layer as the touch driving electrodes, or can be displayed in the different layer from the touch driving electrodes with the dielectric layer interposed in-between.

The touch electrode portion 315 according to another embodiment of the present disclosure can be substituted by a capacitive touch panel generally known to those in the art.

In this case, the touch panel can be attached onto the encapsulation portion 313 by the use of transparent adhesive member 314. Herein, the transparent adhesive member 314 can include pressure sensitive adhesive (PSA), optically clear adhesive (OCA), or optically clear resin (OCR).

The touch pad portion TPP according to one embodiment of the present disclosure can include a plurality of touch pad electrodes which are disposed in one edge of the touch electrode portion 315 provided in one edge (or upper edge) of the flexible substrate 311 and are electrically connected with the touch electrode portion 315. The plurality of touch pad electrodes can be connected with the touch sensing electrodes and touch driving electrodes through a plurality of touch routing lines in one-to-one correspondence. The touch pad portion TPP can be overlapped with the link line disposed on the flexible substrate 311.

The touch pad portion TPP according to another embodiment of the present disclosure can be disposed in the other edge of the touch electrode portion 315 provided in the other edge of the flexible substrate 311, and can be connected with the touch sensing electrodes and touch driving electrodes through the plurality of touch routing lines in one-to-one correspondence.

If the touch electrode portion 315 is substituted by the touch panel, the touch pad portion TPP can be disposed in one edge of the touch panel or the other edge of the touch panel, and can be connected with the touch sensing electrodes and touch driving electrodes through the plurality of touch routing lines in one-to-one correspondence.

The functional film 317 is attached onto the touch electrode portion 315 by the use of film adhesive member 316, and can be attached to the rear surface (or back surface) of the cover window 100 by the use of module bonding member 200. Herein, the film adhesive member 316 can include pressure sensitive adhesive (PSA), optically clear adhesive (OCA), or optically clear resin (OCR).

The functional film 317 according to one embodiment of the present disclosure can include a reflection preventing layer (or reflection preventing film) configured to prevent a reflection of ambient light so as to improve contrast ratio and outdoor visibility for an image displayed on the flexible display panel 310. For example, the reflection preventing layer can include a circular polarizing layer (or circular polarizing film) configured to prevent ambient light being incident through the cover window 100 from being reflected on the thin film transistor and/or lines disposed in the pixel array 312 and being advanced toward the cover window 100.

The functional film 317 can further include a barrier layer (or barrier film) configured to firstly prevent a permeation of moisture or oxygen, wherein the barrier layer can be formed of a material with low moisture permeation, for example, polymer.

Also, the functional film 317 can further include a light path control layer (or light path control film) configured to control a path of light emitted from the pixel array 312 to the cover window 100. The light path control layer can have a deposition structure obtained by alternately depositing a high refraction layer and a low refraction layer, whereby a path of light being provided from the pixel array 312 can be changed, to thereby minimize a color shift in accordance with a viewing angle.

Selectively, the functional film 317 can be disposed between the touch electrode portion 315 and the encapsulation portion 313. In this case, the touch electrode portion 315 can be attached to the cover window 100 by the use of module bonding member 200.

The first back plate BP1 can be attached to the rear surface (or back surface) of the flexible substrate 311 being overlapped with the pixel array 312, whereby the rear surface (or back surface) of the flexible substrate 311 being overlapped with the pixel array 312 is maintained in a plane state.

The second back plate BP2 can be attached to one edge of the rear surface (or back surface) of the flexible substrate 311 being overlapped with the display pad portion DPP, whereby the one edge of the rear surface (or back surface) of the flexible substrate 311 is maintained in a plane state.

A link line area of the flexible substrate 311, which is provided with link lines while being overlapped with the first back plate BP1 and the second back plate BP2, can be defined as the panel bending portion 300d which is bent with a predetermined radius of curvature. That is, the panel bending portion 300d of the flexible substrate 311 is not supported in a plane state by the first back plate BP1 and the second back plate BP2, whereby the panel bending portion 300d of the flexible substrate 311 can be freely bent. Accordingly, the panel bending portion 300d of the flexible substrate 311 is bent to surround one lateral surface of the first back plate BP1 confronting the second back plate BP2, whereby the display pad portion DPP can be overlapped with one rear edge of the first back plate BP1. Thus, the flexible display module 300 is bent to provide a predetermined radius of curvature in the panel bending portion 300d of the flexible substrate 311, to thereby realize a small bezel width.

The bending maintenance member 318 can be disposed between the first back plate BP1 and the second back plate BP2 being overlapped with each other with respect to a thickness direction Z of the flexible display panel 310. The bending maintenance member 318 fixes the second back plate BP2 disposed in (or at) the rear surface of the first back plate BP1 to one rear edge of the first back plate BP1 in accordance with the bending of the flexible substrate 311 so that it is possible to maintain the bending state and bending shape of the flexible substrate 311.

One surface (or front surface) of the bending maintenance member 318 can be attached to one rear edge of the first back plate BP1. The other surface (or rear surface) of the bending maintenance member 318 can be attached to the second back plate BP2.

The bending maintenance member 318 according to one embodiment of the present disclosure can include a bar-shaped metal material structure, a plastic-material structure, or a double-sided tape. Selectively, the bending maintenance member 318 according to one embodiment of the present disclosure can include a bending guide portion 318a which is protruding toward the panel bending portion 300d of the flexible substrate 311. An outer lateral surface of the bending guide portion 318a can have a curved-line shape which enables to bend the panel bending portion 300d of the flexible substrate 311 in a curved-line shape.

The flexible display panel 310 according to one embodiment of the present disclosure can further include a cover layer (or micro cover layer) 319 configured to cover the panel bending portion 300d of the flexible substrate 311.

The cover layer 319 can cover the panel bending portion 300d of the flexible substrate 311 disposed between the encapsulation portion 313 and the display pad portion DPP.

The cover layer 319 can include a polymer material, wherein the cover layer 319 can be coated on to the panel bending portion 300d of the flexible substrate 311 so as to cover the link line between the encapsulation portion 313 and the display pad portion DPP. The cover layer 319 protects the link line from an external shock, and also prevents a moisture permeation into the link line. Especially, when the panel bending portion 300d of the flexible substrate 311 is bent in a curved-line shape with a predetermined radius of curvature, the cover layer 319 is provided to position the link line on a neutral plane. That is, when the panel bending portion 300d of the flexible substrate 311 is bent with a predetermined radius of curvature, the neutral plane, in which each of a tensile force and a compressive force becomes '0' (zero), exists between the flexible substrate 311 and the cover layer 319. Accordingly, the cover layer 319 can include a material whose elastic coefficient is relatively higher than that of the flexible substrate 311 so that the link lines can be positioned in the neutral plane. Thus, the link lines are positioned in the neutral plane between the cover layer 319 and the flexible substrate 311. That is, when the panel bending portion 300d of the flexible substrate 311 is bent in a curved-line shape, a bending stress of '0' is applied to the link lines positioned in the neutral line between the cover layer 319 and the flexible substrate 311, whereby the link lines can be bent without any damage caused by the bending stress.

The flexible display module 300 according to one embodiment of the present disclosure can further include a conductive heat dissipating portion 320 connected with the rear surface (or back surface) of the flexible display panel 310.

The conductive heat dissipating portion 320 can be attached to the rear surface (or back surface) of the first back plate BP1. The conductive heat dissipating portion 320 protects the flexible display panel 310 from a shock, and radiates heat of the flexible display panel 310. The conductive heat dissipating portion 320 can be expressed as a heat dissipating tape, a heat dissipating cushion tape, a conductive heat dissipating tape, a heat dissipating sheet, a heat dissipating ground sheet, or a conductive heat dissipating sheet.

The conductive heat dissipating portion 320 according to one embodiment of the present disclosure can be attached to the entire rear surface of the first back plate BP1. In this case, according to one surface (or front surface) of the bending maintenance member 318 being attached to the conductive heat dissipating portion 320, a distance between the first back plate BP1 and the second back plate BP2 is increased so that it is possible to reduce a bending repulse force by the panel bending portion 300d of the flexible substrate 311 being bent in a curved-line shape.

The conductive heat dissipating portion 320 according to one embodiment of the present disclosure can be attached to the remaining portions of the rear surface of the first back plate BP1 except an arrangement area for the bending maintenance member 318. In this case, one surface (or front surface) of the bending maintenance member 318 is directly attached to the first back plate BP1 from which some portions of the conductive heat dissipating portion 320 are removed, whereby a thickness of the flexible display panel 310 can be reduced.

The conductive heat dissipating portion 320 according to one embodiment of the present disclosure can include a heat dissipating member 321, a cushion member 323, and an adhesive member 325.

The heat dissipating member 321 can include a heat dissipating layer having a metal material with a relatively high thermal conductivity. The heat dissipating member 321 according to one embodiment of the present disclosure can include a metal layer of copper (Cu). The heat dissipating member 321 according to another embodiment of the present disclosure can include a metal layer of copper (Cu), and a graphite layer coated onto the metal layer. The heat dissipating member 321 can provide a heat dissipating function, a ground function, and a protection function for protecting the rear surface of the flexible display panel 310.

The cushion member 323 can include a foam tape or foam pad connected with a front surface of the heat dissipating member 321. The cushion member 323 can absorb a shock.

The adhesive member 325 can be connected with a front surface of the cushion member 323. The adhesive member 325 can include an uneven surface structure (or embossing structure) formed in its surface. The uneven surface structure of the adhesive member 325 prevents bubbles from being generated between the first back plate BP1 and the conductive heat dissipating member 320 for an attachment process between the first back plate BP1 and the conductive heat dissipating portion 320 so that it is possible to omit a deformation process for removing bubbles generated between the first back plate BP1 and the conductive heat dissipating portion 320.

The display driving circuit portion 330 can be connected with the display pad portion DPP of the flexible display panel 310, whereby the display driving circuit portion 330 can be disposed in (or at) the rear surface of the flexible display panel 310. The display driving circuit portion 330 can display an image on the pixel array 312 of the flexible display panel 310, and can sense a user's touch through the touch electrode portion 315 of the flexible display panel 310.

The display driving circuit portion 330 according to one embodiment of the present disclosure can include a panel flexible circuit film 331, a driving integrated circuit 333, a flexible circuit board 335, and a touch flexible circuit film 337.

The panel flexible circuit film 331 can be electrically connected with the display pad portion DPP prepared in the flexible substrate 311 while being disposed in (or at) the rear surface of the flexible display panel 310. The panel flexible circuit film 331 according to one embodiment of the present disclosure can be attached to the display pad portion DPP prepared in the flexible substrate 311 through the use of film attachment process using an anisotropic conductive film. For example, the panel flexible circuit film 331 can be a chip on film.

The driving integrated circuit 333 can be mounted on the panel flexible circuit film 331 disposed in (or at) the rear surface of the flexible display panel 310. The driving integrated circuit 333 according to one embodiment of the present disclosure can be mounted on the panel flexible circuit film 331 by a chip bonding process or surface mounting process. For example, the driving integrated circuit 333 can be mounted on the panel flexible circuit film 331 disposed between the display pad portion DPP and the flexible circuit board 335. In this case, the driving integrated circuit 333 can be disposed between the rear surface of the flexible display panel 310 and the housing 500.

The driving integrated circuit 333 according to one embodiment of the present disclosure can generate a data signal and a gate control signal on the basis of timing synchronized signal and video data supplied from an external host driving system (or host driving circuit), can supply the data signal to the data line of each pixel through the display pad portion DPP, and can supply the gate control signal to the gate driving circuit. The driving integrated circuit 333 can be disposed in (or at) the rear surface of the flexible display panel 310.

Selectively, the driving integrated circuit 333 is not mounted on the panel flexible circuit film 331, and is mounted on (or bounded onto) a chip mounting area defined in the flexible substrate 311, whereby the driving integrated circuit 333 can be electrically connected with the display pad portion DPP, and can be connected with the signal line in each of the pixel array 312 and the gate driving circuit disposed on the flexible substrate 311. In this case, the panel flexible circuit film 331 can relay a signal transport between the display pad portion DPP and the host driving system, or can be omitted.

The flexible circuit board 335 can be electrically connected with the panel flexible circuit film 331 in (or at) the rear surface of the flexible display panel 310. The flexible circuit board 335 according to one embodiment of the present disclosure can be electrically connected with a pad electrode portion prepared in the panel flexible circuit film 331 by a film attachment process using an anisotropic conductive film, and can be overlapped with the first back plate BP1 of the flexible display panel 310. The flexible circuit board 335 can provide the timing synchronized signal and video data, supplied from the host driving system, to the driving integrated circuit 333 through the display pad portion DPP, and can provide voltages which are necessary for driving the pixel array 312, the gate driving circuit, and the driving integrated circuit 333. The flexible circuit board 335 can be expressed as a main flexible printed circuit board or a display driving circuit board.

The flexible circuit board 335 according to one embodiment of the present disclosure can include a circuit body portion 335a, a semiconductor circuit chip 335b, circuit components 335c, an extension line portion 335d, and a board connector 335e.

The circuit body portion 335a can be electrically connected with the pad electrode portion prepared in the panel flexible circuit film 331. The circuit body portion 335a can include a board pad portion BPP disposed in one surface confronting the conductive heat dissipating portion 320. The board pad portion BPP can be electrically connected with the pad electrode portion prepared in the panel flexible circuit film 331 by a film attachment process using an anisotropic conductive film. For example, the circuit body portion 335a can have a rectangular shape.

The semiconductor circuit chip 335b can be mounted on the circuit body portion 335a, and can process and output a signal supplied from the board pad portion BPP and the board connector 335e. The semiconductor circuit chip 335b can generate a signal and power needed to display an image on the flexible display panel 310. For example, the semiconductor circuit chip 335b can include a power generation circuit chip or a data processing circuit chip.

The circuit components 335c can be mounted on at least one edge of both edges of the circuit body portion 335a with respect to a first direction X. The circuit components 335c according to one embodiment of the present disclosure can include at least one among a resistor, a capacitor, an inductor, and an integrated circuit.

The extension line portion 335d can extend by a predetermined length from the other edge of the circuit body portion 335a. For example, the extension line portion 335d can have a linear shape or non-linear shape. The length and shape of the extension line portion 335d can be set in accordance with a position of the host driving system (or host driving board) disposed in (or at) the rear surface of the flexible display module 300.

The board connector 335e can be provided in the end of the extension line portion 335d and can be electrically connected with the host driving system.

The flexible circuit board 335 according to one embodiment of the present disclosure can further include at least one first ground pad GP1 disposed in the circuit body portion 335a, and at least one second ground pad GP2 disposed in the circuit body portion 335a.

The at least one first ground pad GP1 can be prepared in the first edge area of the circuit body portion 335a while being adjacent to the first circuit components 335c1. The at least one first ground pad GP1 can be electrically connected with the conductive heat dissipating portion 320.

The at least one second ground pad GP2 can be prepared in the second edge area of the circuit body portion 335a while being adjacent to the second circuit components 335c2. The at least one second ground pad GP2 can be electrically connected with the conductive heat dissipating portion 320.

The flexible circuit board 335 according to one embodiment of the present disclosure can further include a touch connector 335f. The touch connector 335f can be mounted on the circuit body portion 335a, and can be electrically connected with the touch flexible circuit film 337.

The touch flexible circuit film 337 can be electrically connected with the touch pad portion TPP prepared in the flexible display panel 310 by a film attachment process using an anisotropic conductive film, and can be electrically connected with the touch connector 335f mounted on the flexible circuit board 335. The touch flexible circuit film 337 can supply a touch driving signal, which is provided from the flexible circuit board 335, to the touch electrodes through the touch pad portion TPP, and can supply a signal corresponding to a capacitance change in the touch electrodes to the flexible circuit board 335 through the touch pad portion TPP.

The touch flexible circuit film 337 according to one embodiment of the present disclosure can include a touch bonding portion attached to the touch pad portion TPP, a touch connector terminal 337b connected with the touch connector 335f of the flexible circuit board 335, a film bending portion 337a between the touch bonding portion and the touch connector terminal 337b, and a circuit portion between the film bending portion 337a and the touch connector terminal 337b. The film bending portion 337a can be bent in a curved-line shape to surround the panel bending portion 300d of the flexible substrate 311. In this case, the touch flexible circuit film 337 can have uneven surface portions caused by a bending repulsive force of the film bending portion 337a. In order to prevent the uneven surface portions of the touch flexible circuit film 337, at least some portions of the film bending portion 337a can have a relatively smaller thickness in comparison to that of the circuit portion.

Selectively, the touch flexible circuit film 337 can be connected with the host driving system instead of the touch connector 335f of the flexible circuit board 335. In this case, it is possible to omit the touch connector 335f mounted on the flexible circuit board 335.

The shield member 350 can be configured to cover the display driving circuit portion 330 and is attached to the conductive heat dissipating portion 320 so that it is possible to prevent the driving integrated circuit 333 disposed in (or at) the rear surface of the flexible display panel 310 from being damaged by a physical contact with structures (or housing) in accordance with a vibration and external shock. Furthermore, it is possible to prevent the flexible display panel 310 and the display driving circuit portion 330 from being damaged by static electricity introduced from the external or outside. In this case, the shield member 350 can be attached to the heat dissipating member 321 of the conductive heat dissipating portion 320, or can be electrically connected with the heat dissipating member 321.

The shield member 350 according to one embodiment of the present disclosure can include a shield portion 351 and a shock absorbing portion 355.

The shield portion 351 can be configured to cover the display driving circuit portion 330, can be attached to the conductive heat dissipating portion 320, and can be configured to support the shock absorbing portion 355. The shield portion 351 electrically connects each of the at least one of the first ground pad GP1 disposed in the flexible circuit board 335 and the at least one of the second ground pad GP2 disposed in the flexible circuit board 335 with the heat dissipating member 321 of the conductive heat dissipating portion 320, whereby the ground pad GP1 and GP2 disposed in the flexible circuit board 335 can be grounded to the heat dissipating member 321 of the conductive heat dissipating portion 320.

The shield portion 351 according to one embodiment of the present disclosure can be formed to cover all the display pad portion DPP, the panel flexible circuit film 331, the driving integrated circuit 333, and a part of the flexible circuit board 335 disposed in (or at) the rear surface of the flexible display panel 310, and can be attached to the conductive heat dissipating portion 320.

The shield portion 351 according to another embodiment of the present disclosure can be formed to cover all the panel bending portion 300d of the flexible display panel 310 including the display pad portion DPP, the panel flexible circuit film 331, the driving integrated circuit 333, and a part of the flexible circuit board 335, and can be attached to the conductive heat dissipating portion 320.

The shock absorbing portion 355 can be connected with the shield member 350 overlapped with the driving integrated circuit 333. The shock absorbing portion 355 can be disposed between the shield member 350 and the driving integrated circuit 333, and can be configured to absorb a shock transmitted to the driving integrated circuit 333 so that it is possible to prevent the driving integrated circuit 333 from being damaged by a physical contact with structures (or housing) in accordance with a vibration or external shock. The shock absorbing portion 355 can be in contact with the front surface of the driving integrated circuit 333, or can be configured to surround the front and lateral surfaces of the driving integrated circuit 333.

The flexible display module 300 according to one embodiment of the present disclosure can further include a heat insulation tape (or heat blocking tape) 370.

The heat insulation tape 370 minimizes a transmission of heat generated in the display driving circuit portion 330 to the flexible display panel 310, whereby it is possible to minimize or prevent a temperature rise of the flexible display panel 310 in accordance with the heat generation of the display driving circuit portion 330.

For example, a transmission of heat generated in the driving integrated circuit 333 can be focused on an IC overlap area which is overlapped with the driving integrated circuit 333 of the flexible display panel 310. In the same manner, a transmission of heat generated in the semiconductor circuit chip 335b can be focused on a chip overlap area which is overlapped with the semiconductor circuit chip 335b of the flexible circuit board 335 of the flexible display panel 310. Herein, the conductive heat dissipating portion 320 radiates the heat generated when the flexible display panel 310 is driven, however, the heat generated in the display driving circuit portion 330 can be transmitted to the flexible display panel 310 through the conductive heat dissipating portion 320. Accordingly, when an image is displayed on the flexible display panel 310, a luminance can be not uniform due to a local temperature rise of the IC overlap area and/or chip overlap area in the flexible display panel 310, and a lifespan of a light emitting device disposed on the pixel corresponding to the IC overlap area and/or chip overlap area can be shortened. Accordingly, the heat insulation tape 370 is disposed between the flexible display panel 310 and the display driving circuit portion 330, whereby it is possible to minimize or prevent the transmission of heat generated in the display driving circuit portion 330 to the flexible display panel 310, to thereby prevent a deterioration of picture quality caused by the local temperature rise on the flexible display panel 310.

The heat insulation tape 370 according to one embodiment of the present disclosure can be disposed between the flexible display panel 310 and the driving integrated circuit 333. For example, the heat insulation tape 370 according to one embodiment of the present disclosure can be attached to one surface of the panel flexible circuit film 331 which is overlapped with the driving integrated circuit 333 and confronts with the conductive heat dissipating portion 320. The heat insulation tape 370 according to one embodiment of the present disclosure insulates the heat generated in the driving integrated circuit 333, to thereby prevent or minimize the transmission of heat generated in the driving integrated circuit 333 to the conductive heat dissipating portion 320 and the flexible display panel 310.

The heat insulation tape 370 according to another embodiment of the present disclosure can be disposed between the flexible display panel 310 and the flexible circuit board 335. For example, the heat insulation tape 370 according to another embodiment of the present disclosure can be attached to one surface of the flexible circuit board 335 which is overlapped with the semiconductor circuit chip 335b and confronts with the conductive heat dissipating portion 320. The heat insulation tape 370 according to another embodiment of the present disclosure insulates the heat generated in the semiconductor circuit chip 335b, to thereby prevent or minimize the transmission of heat generated in the semiconductor circuit chip 335b to the conductive heat dissipating portion 320 and the flexible display panel 310.

The heat insulation tape 370 according to another embodiment of the present disclosure can include a first heat insulation tape disposed between the flexible display panel 310 and the driving integrated circuit 333, and a second heat insulation tape disposed between the flexible display panel 310 and the flexible circuit board 335.

The first heat insulation tape can be attached to one surface of the panel flexible circuit film 331 which is overlapped with the driving integrated circuit 333 and confronts with the conductive heat dissipating portion 320, to thereby prevent or minimize the transmission of heat generated in the driving integrated circuit 333 to the conductive heat dissipating portion 320 and the flexible display panel 310.

The second heat insulation tape can be attached to one surface of the flexible circuit board 335 which is overlapped with the semiconductor circuit chip 335b and confronts with the conductive heat dissipating portion 320, to thereby prevent or minimize the transmission of heat generated in the semiconductor circuit chip 335b to the conductive heat dissipating portion 320 and the flexible display panel 310.

Accordingly, the heat insulation tape 370 can include a heat insulation layer, and an adhesive layer combined with the heat insulation layer. The heat insulation layer can include polymer resin of an insulating material, for example, polyethylene resin or polyester resin. The heat insulation layer can include a heat insulator with air, and the heat insulator can be included in the polymer resin of the insulating material. The adhesive layer can include acrylic resin or conductive acrylic resin.

The housing 500 can accommodate the flexible display panel 300, and can support the cover window 100. For example, the housing 500 can be connected with the sidewall portion 130 of the cover window 100, to thereby support the cover window 100.

The housing 500 according to one embodiment of the present disclosure can further include a rear housing 510 configured to cover the rear surface of the flexible display module 300 under the condition that a circuit receiving space 501 is interposed in-between, and a lateral housing 530 configured to support the cover window 100.

The rear housing 510 is disposed in the outermost rear surface of the electronic device, wherein the rear housing 510 can include a plastic material, a metal material, or a glass material. For example, the rear housing 510 can include a glass material with a color coating layer.

The lateral housing 530 according to one embodiment of the present disclosure is disposed in the outermost lateral surface of the electronic device, wherein the lateral housing 530 can be bent from the edge of the rear housing 510 and be connected with the sidewall portion 130 of the cover window 100.

The lateral housing 530 according to another embodiment of the present disclosure can be formed of a plastic material, a metal material, or a glass material, and can be disposed in the edge of the sidewall portion 130 of the cover window 100.

The circuit receiving space 501 is prepared between the rear surface of the flexible display module 300 and the rear housing 510, wherein the host driving system, memory and battery can be received in the circuit receiving space 501.

The electronic device according to one embodiment of the present disclosure can further include a middle frame 700.

The middle frame 700 is disposed in the circuit receiving space 501 of the housing 500, and the middle frame 700 can support circuit components disposed in the circuit receiving space 501. The middle frame 700 can support the cover window 100. The middle frame 700 according to one embodiment of the present disclosure can include a middle plate 710 and a middle sidewall 730.

The middle plate 710, which is disposed between the rear surface of the flexible display module 300 and the rear housing 510, can support the circuit components disposed in the circuit receiving space 501.

The middle sidewall 730, which is vertically connected with a lateral surface of the middle plate 710, can support the sidewall portion 130 of the cover window 100.

Selectively, the lateral housing 530 of the housing 500 can be substituted by the middle sidewall 730 of the middle frame 700. In this case, the middle sidewall 730 of the middle frame 700 can be disposed between the sidewall portion 130 of the cover window 100 and the edge of the rear housing 510, whereby it is possible to omit the lateral housing 530 of the housing 500.

The flexible display module 300 according to one embodiment of the present disclosure and the electronic device comprising the same includes the shield member 350 having the shock absorbing portion 355 overlapped with the driving integrated circuit 333 so that it is possible to prevent the driving integrated circuit 333 from being damaged by vibration or external shock, and furthermore, it is possible to prevent the flexible display panel 310 and the display driving circuit portion 330 from being damaged by static electricity introduced from the external or outside. Also, the flexible display module 300 according to one embodiment of the present disclosure and the electronic device comprising the same further includes the heat insulation tape 370 disposed between the display driving circuit portion 330 and the flexible display panel 310, whereby the temperature rise of the flexible display panel 310 caused by the heat generation of the display driving circuit portion 330 can be prevented or minimized.

Figure 6:
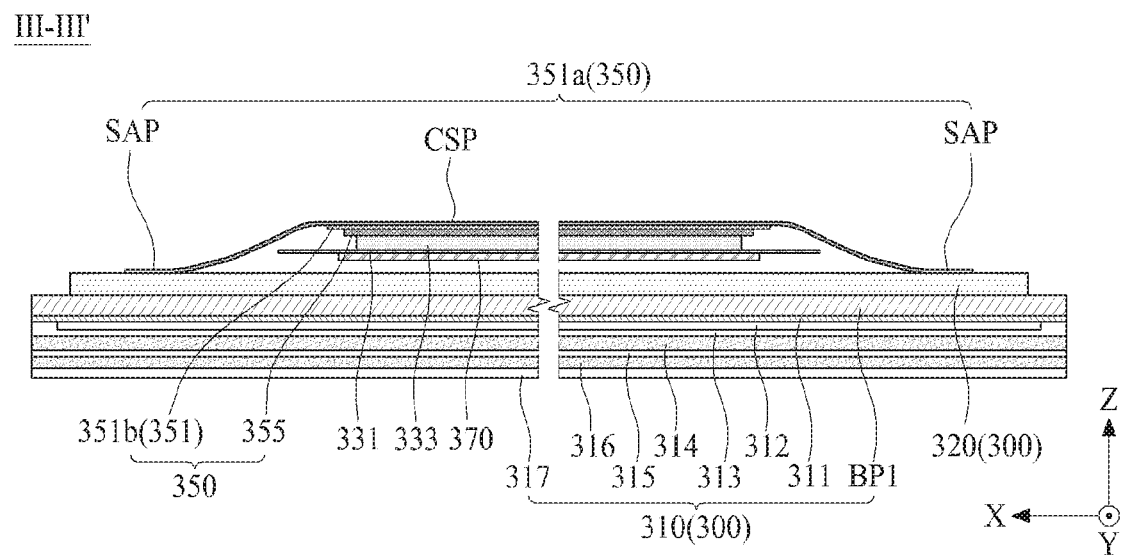
FIG. 6 is a cross-sectional view taken along line III-III' of FIG. 4.
Figure 7:
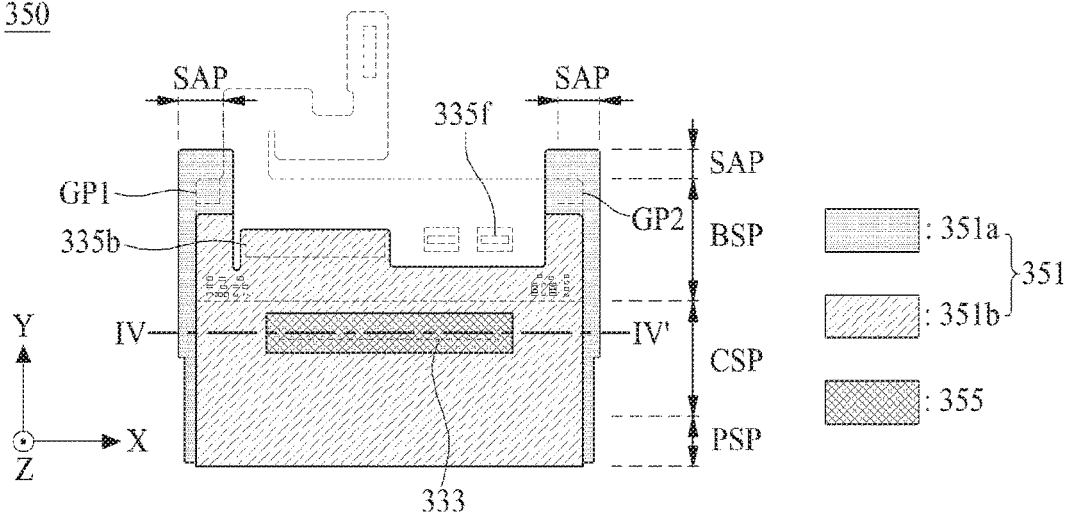
FIG. 7 illustrates a rear surface of a shield member shown in FIG. 4.
Figure 8:
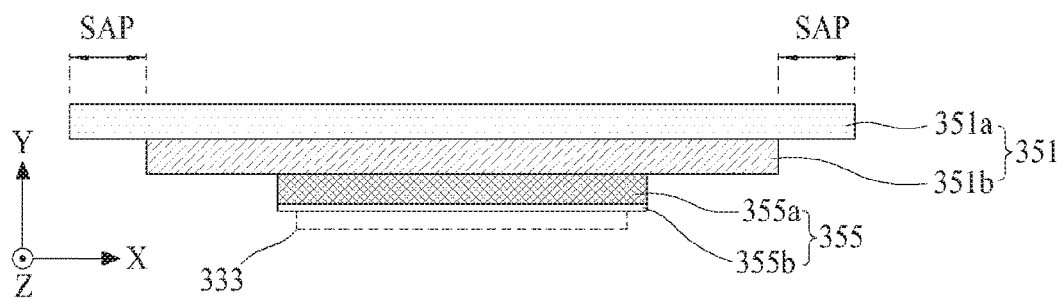
FIG. 8 is a cross-sectional view taken along line IV-IV' of FIG. 7.

FIG. 6 is a cross-sectional view taken along line III-III' of FIG. 4, FIG. 7 illustrates a rear surface of the shield member shown in FIG. 4, and FIG. 8 is a cross-sectional view taken along line IV-IV' of FIG. 7, which illustrate the shield member according to one embodiment of the present disclosure.

Referring to FIGS. 3, 4, and 6 to 8, the shield member 350 according to one embodiment of the present disclosure can include the shield portion 351 and the shock absorbing portion 355.

The shield portion 351 can cover the display driving circuit portion 330, can be attached to the conductive heat dissipating portion 320, and can support the shock absorbing portion 355. The shield portion 351 according to one embodiment of the present disclosure can include a panel shield portion PSP, a circuit shield portion CSP, a board shield portion BSP, and a shield adhesion portion SAP.

The panel shield portion PSP can cover the panel bending portion 300d of the flexible display panel 310 including the display pad portion DPP. For example, the panel shield portion PSP can cover all the panel bending portion 300d of the flexible display panel 310 which is bent in the curved-line shape. In this case, the panel shield portion PSP is formed in the rectangular shape, and can be disposed on the cover layer 319 disposed on the panel bending portion 300d of the flexible display panel 310. The panel shield portion PSP protects the panel bending portion 300d of the flexible display panel 310, and furthermore, prevents the static electricity introduced to the panel bending portion 300d of the flexible display panel 310 so that it is possible to protect the link lines disposed on the panel bending portion 300d of the flexible display panel 310 from the static electricity, and to block an electrical noise signal introduced to the panel bending portion 300d of the flexible display panel 310. Also, the panel shield portion PSP covers a gap between the bending maintenance member 318 and the conductive heat dissipating portion 320, to thereby prevent a light leakage in (or at) the rear surface of the flexible display panel 310.

The circuit shield portion CSP can be connected with the panel shield portion PSP, or can extend from the panel shield portion PSP. The circuit shield portion CSP covers the panel flexible circuit film 331, and the driving integrated circuit 333 mounted on the panel flexible circuit film 331, and supports the shock absorbing portion 355. For example, the circuit shield portion CSP can cover all the panel flexible circuit film 331 disposed between the display pad portion and the flexible circuit board 335. The circuit shield portion CSP protects the panel flexible circuit film 331 including the driving integrated circuit 333, and blocks the static electricity introduced to the panel flexible circuit film 331 so that it is possible to protect the driving integrated circuit 333 and the signal lines on the panel flexible circuit film 331 from the static electricity, and to block an electrical noise signal introduced to the panel flexible circuit film 331.

The board shield portion BSP can be connected with the circuit shield portion CSP, or can extend from the circuit shield portion CSP, and then can cover some of the flexible circuit board 335. The board shield portion BSP according to one embodiment of the present disclosure can cover the circuit body portion 335a of the flexible circuit board 335 except for the area for the touch connector 335f. The board shield portion BSP can be disposed on the circuit body portion 335a of the flexible circuit board 335 so as to cover one edge portion having the board pad portion BPP and the circuit components 335c, and the semiconductor circuit chip 335b. For example, with respect to the first direction X, the board shield portion BSP can include a first board shield portion disposed on the board pad portion BPP of the circuit body portion 335a, a pair of second board shield portions protruding from the first board shield portion and disposed on the first and second ground pads GP1 and GP2 of the circuit body portion 335a, and a third board shield portion protruding from the first board shield portion and disposed on the semiconductor circuit chip 335b. The board shield portion BSP protects the board pad portion BPP, the circuit components 335c and the semiconductor circuit chip 335b, and furthermore, blocks the static electricity introduced to the flexible circuit board 335 so that it is possible to protect the flexible circuit board 335 from the static electricity and to block an electrical noise signal introduced to the flexible circuit board 335.

The shield adhesion portion SAP extends from each of the panel shield portion PSP, the circuit shield portion CSP and the board shield portion BSP, and can be attached to the conductive heat dissipating portion 320. For example, the shield adhesion portion SAP extends from both lateral surfaces of each of the panel shield portion PSP and the circuit shield portion CSP along the first direction X, and extends from the board shield portion BSP along the first direction X and second direction Y, and then can be attached to the conductive heat dissipating portion 320.

The shield portion 351 can include a conductive tape 351a and an insulating tape 351b.

The conductive tape 351a can include the panel shield portion PSP, the circuit shield portion CSP, the board shield portion BSP and the shield adhesion portion SAP. The conductive tape 351a according to one embodiment of the present disclosure can include a base film, a metal layer attached to a rear surface of the base film by the use of adhesive layer, and a conductive adhesion layer formed in (or at) a rear surface of the metal layer. For example, the conductive tape 351a can be a shield single-sided tape. In this case, the base film can have a black color so as to prevent a light leakage in (or at) the rear surface of the flexible display panel 310 through the gap between the bending maintenance member 318 and the conductive heat dissipating portion 320.

The shield adhesion portion SAP of the conductive tape 351a is attached to the first and second ground pads GP1 and GP2 prepared in the flexible circuit board 335, and can be attached to the conductive heat dissipating portion 320. Accordingly, the shield adhesion portion SAP of the conductive tape 351a electrically connects the first and second ground pads GP1 and GP2 prepared in the flexible circuit board 335 with the conductive heat dissipating portion 320, whereby the first and second ground pads GP1 and GP2 can be grounded to the heat dissipating member 321 of the conductive heat dissipating portion 320.

The insulating tape 351b can be combined with some of the panel shield portion PSP, the circuit shield portion CSP and the board shield portion BSP included in the conductive tape 351a. That is, the insulating tape 351b is combined with the remaining portions of the conductive tape 351a except the shield adhesion portion SAP, whereby some of the panel shield portion PSP, the circuit shield portion CSP and the board shield portion BSP included in the shield portion 351 can be covered. The insulating tape 351b according to one embodiment of the present disclosure can include an insulating film attached to some of the panel shield portion PSP, the circuit shield portion CSP and the board shield portion BSP included in the conductive tape 351a. The insulating tape 351b can electrically insulate each of the flexible circuit board 335, the panel flexible circuit film 331, and the panel bending portion 300d of the flexible display panel 310 from the conductive tape 351a.

The shock absorbing portion 355 can be combined with the shield portion 351 overlapped with the driving integrated circuit 333. For example, the shock absorbing portion 355 can be attached to one surface of the insulating tape 351b combined with the circuit shield portion CSP overlapped with the driving integrated circuit 333. According to the shock absorbing portion 355 being disposed between the driving integrated circuit 333 and the insulating tape 351b of the shield member 350, the shock to be transmitted to the driving integrated circuit 333 is absorbed in the shock absorbing portion 355 so that it is possible to prevent the driving integrated circuit 333 from being damaged by physical contact with the structure (or housing) in accordance with the vibration or external shock.

The shock absorbing portion 355 according to one embodiment of the present disclosure can include a foam tape (or foam pad) 355a attached to one surface of the insulating tape 351b combined with the circuit shield portion CSP overlapped with the driving integrated circuit 333. The foam tape 355a is disposed between the driving integrated circuit 333 and the insulating tape 351b of the shield member 350 so that it is possible to absorb the shock transmitted to the driving integrated circuit 333.

The shock absorbing portion 355 according to one embodiment of the present disclosure can further include an adhesion layer 355b formed in the foam tape 355a. The adhesion layer 355b can be formed in (or at) a rear surface of the foam tape 355a directly confronting the driving integrated circuit 333. According to the adhesion layer 355b being adhered to the front surface of the driving integrated circuit 333, the adhesion state between the foam tape 355a and the driving integrated circuit 333 is maintained so that it is possible to prevent the foam tape 355a from being separated from the driving integrated circuit 333 by the vibration and/or external shock.

Figure 9:
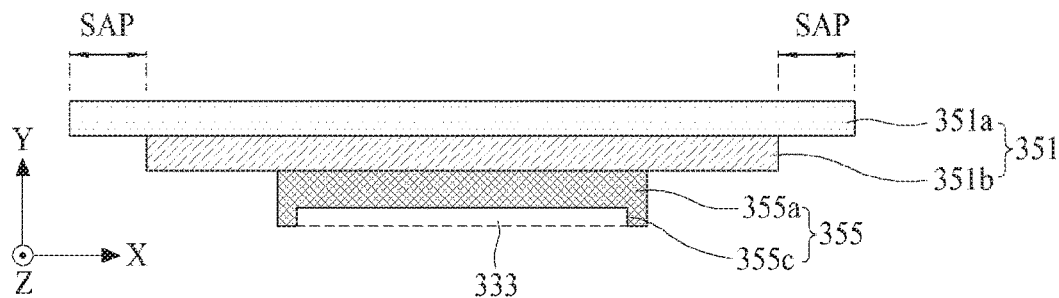
FIG. 9 is another cross-sectional view taken along line IV-IV' of FIG. 7.

Meanwhile, the foam tape 355a of the shock absorbing portion 355 can further include an integrated circuit insertion groove 355c, as shown in FIG. 9.

The integrated circuit insertion groove 355c can be formed in (or at) the rear surface of the foam tape 355a. A size of the integrated circuit insertion groove 355c can be identical to or larger than a size of the driving integrated circuit 333. A depth (or height) of the integrated circuit insertion groove 355c can be identical to or larger than a depth of the driving integrated circuit 333. Accordingly, the driving integrated circuit 333 can be inserted into the integrated circuit insertion groove 355c. Thus, the foam tape 355a according to the embodiment of the present disclosure surrounds the front and lateral surfaces of the driving integrated circuit 333 so that it is possible to absorb the shock transmitted to the front and lateral surfaces of the driving integrated circuit 333.

In one or more embodiments of the present disclosure, widths of the shield portion 351 and the shock absorbing portion 355 can be different. For example, the shield portion 351 can be wider than the shock absorbing portion 355 in the first direction X. Also, portions of the shield portion 351 and portions of the shock absorbing portion 355 can have different widths. For example, FIGS. 7, 8 and 9 show the conductive tape 351a being wider than the insulating tape 351b, which in turn is wider than the shock absorbing portion 355 in the first direction X. However, such is not required, and the shield portion 351 can be narrower than the shock absorbing portion 355 in the first direction X, or they can be equal in width.

In one or more embodiments of the present disclosure, areas of the shield portion 351 and the shock absorbing portion 355 can be different. For example, the shield portion 351 can be greater in area than the shock absorbing portion 355 in a plan view. Also, portions of the shield portion 351 and portions of the shock absorbing portion 355 can have different areas. For example, FIGS. 7, 8 and 9 show the conductive tape 351a being greater in area than the insulating tape 351b, which in turn is greater in area than the shock absorbing portion 355. However, such is not required, and the shield portion 351 can be smaller in area than the shock absorbing portion 355, or they can be equal in area.

In one or more embodiments of the present disclosure, reference to 'combined' can include one or more of attachment to, placement on, arrangement with, and association, or other relationships.

The flexible display module according to the embodiment of the present disclosure and the electronic device comprising the same can be described as follows.

According to an embodiment of the present disclosure, a flexible display module comprises a flexible display panel including a display portion, a panel bending portion and a display pad portion; a display driving circuit portion disposed in (or at) a rear surface of the flexible display panel and configured to include a driving integrated circuit connected with the display pad portion; and a shield member configured to cover the display driving circuit portion in (or at) the rear surface of the flexible display panel and configured to have a shock absorbing portion overlapped with the driving integrated circuit.

According to one or more embodiments of the present disclosure, the shock absorbing portion can include a foam tape combined with the shield member overlapped with the driving integrated circuit.

According to one or more embodiments of the present disclosure, the foam tape can be in contact with a front surface of the driving integrated circuit, or can surround front and lateral surfaces of the driving integrated circuit.

According to one or more embodiments of the present disclosure, the shock absorbing portion can further include an adhesion layer combined with the foam tape and adhered to the driving integrated circuit.

According to one or more embodiments of the present disclosure, the flexible display module can further include a conductive heat dissipating portion combined with the rear surface of the flexible display panel, wherein the shield member can be attached to the conductive heat dissipating portion.

According to one or more embodiments of the present disclosure, the conductive heat dissipating portion can include a heat dissipating member having a heat dissipating layer of a metal material; a cushion member combined with the heat dissipating member; and an adhesion member combined with the cushion member and combined with the rear surface of the flexible display panel, wherein the shield member can be attached to the heat dissipating member.

According to one or more embodiments of the present disclosure, the shield member can further include a panel shield portion configured to cover the panel bending portion of the flexible display panel.

According to one or more embodiments of the present disclosure, the display driving circuit portion can include a panel flexible circuit film connected with the display pad portion; and a flexible circuit board connected with the panel flexible circuit film, wherein the driving integrated circuit can be mounted on the panel flexible circuit film between the display pad portion and the flexible circuit board.

According to one or more embodiments of the present disclosure, the flexible circuit board can include at least one ground pad, and the shield member electrically connects the at least one ground pad with the conductive heat dissipating portion.

According to one or more embodiments of the present disclosure, the shield member can include a shield portion which is configured to cover the display driving circuit portion, attached to the conductive heat dissipating portion, and configured to support the shock absorbing portion, wherein the shield portion can include a panel shield portion configured to cover the panel bending portion of the flexible display panel including the display pad portion; a circuit shield portion configured to cover the panel flexible circuit film and the driving integrated circuit, and to support the shock absorbing portion; a board shield portion configured to cover some of the flexible circuit board; and a shield adhesion portion, extending from each of the panel shield portion, the circuit shield portion and the board shield portion, attached to the conductive heat dissipating portion.

According to one or more embodiments of the present disclosure, the shield portion can include a conductive tape having the panel shield portion, the circuit shield portion, the board shield portion and the shield adhesion portion; and an insulating tape combined with some of the panel shield portion, the circuit shield portion and the board shield portion included in the conductive tape, wherein the shield adhesion portion of the conductive tape is attached to the conductive heat dissipating portion.

According to one or more embodiments of the present disclosure, the flexible circuit board can include at least one ground pad, and the board shield portion of the conductive tape is attached to the at least one ground pad.

According to one or more embodiments of the present disclosure, the flexible display module can further include a heat insulation tape disposed in at least one of one surface of the panel flexible circuit film overlapped with the driving integrated circuit and disposed to confront the conductive heat dissipating portion, and one surface of the flexible circuit board confronting the conductive heat dissipating portion.

According to the embodiment of the present disclosure, an electronic device comprises a flexible display module combined with a cover window; and a housing configured to support the cover window and to accommodate the flexible display module, wherein the flexible display module comprises a flexible display panel including a display portion, a panel bending portion and a display pad portion; a display driving circuit portion disposed at a rear surface of the flexible display panel and configured to include a driving integrated circuit connected with the display pad portion; and a shield member configured to cover the display driving circuit portion (or at) in the rear surface of the flexible display panel and configured to have a shock absorbing portion overlapped with the driving integrated circuit.

According to the embodiment of the present disclosure, an electronic device comprises a flexible display module combined with a cover window; and a housing configured to support the cover window and to accommodate the flexible display module, wherein the flexible display module includes a flexible display panel including a display portion, a panel bending portion and a display pad portion; a conductive heat dissipating portion combined with a rear surface of the flexible display panel; a panel flexible circuit film disposed at the rear surface of the flexible display panel and connected with the display pad portion; a driving integrated circuit mounted on the panel flexible circuit film; a flexible circuit board connected with the panel flexible circuit film; and a shield member configured to cover the display pad portion, the driving integrated circuit and some of the flexible circuit board at the rear surface of the flexible display panel, and attached to the conductive heat dissipating portion, wherein the shield member includes a shock absorbing portion overlapped with the driving integrated circuit.

According to one or more embodiments of the present disclosure, the shock absorbing portion can include a foam tape which is combined with the shield member overlapped with the driving integrated circuit, and is in contact with a front surface of the driving integrated circuit or is configured to surround front and lateral surfaces of the driving integrated circuit.

According to one or more embodiments of the present disclosure, the conductive heat dissipating portion can include a heat dissipating member having a heat dissipating layer of a metal material; a cushion member combined with the heat dissipating member; and an adhesion member combined with the cushion member and combined with the rear surface of the flexible display panel, wherein the shield member can be attached to the heat dissipating member.

According to one or more embodiments of the present disclosure, the flexible circuit board can include at least one ground pad, and the shield member can electrically connect the at least one ground pad with the heat dissipating member.

According to one or more embodiments of the present disclosure, the shield member can include a shield portion which is configured to cover the display pad portion, the driving integrated circuit, and some of the flexible circuit board, and is configured to support the shock absorbing portion, wherein the shield portion can include a conductive tape configured to cover the display pad portion, the driving integrated circuit, and some of the flexible circuit board, and attached to the heat dissipating member and the at least one ground pad; and an insulating tape combined with the conductive tape overlapped with each of the display pad portion, the driving integrated circuit, and some of the flexible circuit board.

According to one or more embodiments of the present disclosure, the flexible display module can further include a heat insulation tape which is disposed in at least one of one surface of the panel flexible circuit film overlapped with the driving integrated circuit and disposed to confront the conductive heat dissipating portion, and one surface of the flexible circuit board confronting the conductive heat dissipating portion.

In addition to the effects of the present disclosure as mentioned above, additional advantages and features of the present disclosure will be clearly understood by those skilled in the art from the above description of the present disclosure.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A flexible display module comprising:
   a flexible display panel including a display portion, a display pad portion, and a panel bending portion between the display portion and the display pad portion;
   a display driving circuit portion disposed at a rear surface of the flexible display panel and configured to include a driving integrated circuit connected with the display pad portion; and
   a shield member configured to cover the display driving circuit portion at the rear surface of the flexible display panel and configured to have a shock absorbing portion overlapped with the driving integrated circuit,
   wherein the shock absorbing portion includes a foam tape which is combined with the shield member overlapped with the driving integrated circuit, and is in contact with a front surface of the driving integrated circuit or is configured to surround front and lateral surfaces of the driving integrated circuit.

2. The flexible display module according to claim 1, wherein the shock absorbing portion further includes an adhesion layer combined with the foam tape and adhered to the driving integrated circuit.

3. The flexible display module according to claim 1, further comprising a conductive heat dissipating portion combined with the rear surface of the flexible display panel, and attached to the shield member.

4. The flexible display module according to claim 3, wherein the conductive heat dissipating portion includes:
   a heat dissipating member having a heat dissipating layer of a metal material, and attached to the shield member;
   a cushion member combined with the heat dissipating member; and
   an adhesion member combined with the cushion member and combined with the rear surface of the flexible display panel.

5. The flexible display module according to claim 4, wherein the shield member further includes a panel shield portion configured to cover the panel bending portion of the flexible display panel.

6. The flexible display module according to claim 1, wherein the display driving circuit portion includes:
   a panel flexible circuit film connected with the display pad portion; and
   a flexible circuit board connected with the panel flexible circuit film, and
   wherein the driving integrated circuit is mounted on the panel flexible circuit film between the display pad portion and the flexible circuit board.

7. The flexible display module according to claim 6, further comprising a conductive heat dissipating portion combined with the rear surface of the flexible display panel, and attached to the shield member,
   wherein the flexible circuit board includes at least one ground pad, and
   wherein the shield member electrically connects the at least one ground pad with the conductive heat dissipating portion.

8. The flexible display module according to claim 6, wherein the shield member includes a shield portion which is configured to cover the display driving circuit portion, is attached to a conductive heat dissipating portion, and is configured to support the shock absorbing portion, and
   wherein the shield portion includes:
   a panel shield portion configured to cover the panel bending portion of the flexible display panel including the display pad portion;
   a circuit shield portion configured to cover the panel flexible circuit film and the driving integrated circuit, and to support the shock absorbing portion;
   a board shield portion configured to cover some of the flexible circuit board; and
   a shield adhesion portion, extending from each of the panel shield portion, the circuit shield portion and the board shield portion, attached to the conductive heat dissipating portion.

9. The flexible display module according to claim 8, wherein the shield portion includes:
   a conductive tape having the panel shield portion, the circuit shield portion, the board shield portion and the shield adhesion portion; and
   an insulating tape combined with some of the panel shield portion, the circuit shield portion and the board shield portion included in the conductive tape, and
   wherein the shield adhesion portion of the conductive tape is attached to the conductive heat dissipating portion.

10. The flexible display module according to claim 9, wherein the flexible circuit board includes at least one ground pad, and
    wherein the board shield portion of the conductive tape is attached to the at least one ground pad.

11. The flexible display module according to claim 6, further comprising a heat insulation tape disposed in at least one of one surface of the panel flexible circuit film overlapped with the driving integrated circuit and disposed to confront a conductive heat dissipating portion, and one surface of the flexible circuit board confronting the conductive heat dissipating portion.

12. An electronic device comprising:
    a cover window;
    the flexible display module of claim 1; and
    a housing configured to support the cover window and to accommodate the flexible display module.

13. An electronic device comprising:
a flexible display module; and
a housing configured to accommodate the flexible display module,
wherein the flexible display module includes:
   a flexible display panel including a display portion, a display pad portion, and a panel bending portion between the display portion and the display pad portion;
   a conductive heat dissipating portion combined with a rear surface of the flexible display panel;
   a panel flexible circuit film disposed at the rear surface of the flexible display panel and connected with the display pad portion;
   a driving integrated circuit mounted on the panel flexible circuit film;
   a flexible circuit board connected with the panel flexible circuit film; and
   a shield member configured to cover the display pad portion, the driving integrated circuit and some of the flexible circuit board at the rear surface of the flexible display panel, and attached to the conductive heat dissipating portion,
wherein the shield member includes a shock absorbing portion overlapped with the driving integrated circuit, and
wherein the shock absorbing portion includes a foam tape which is combined with the shield member overlapped with the driving integrated circuit, and is in contact with a front surface of the driving integrated circuit or is configured to surround front and lateral surfaces of the driving integrated circuit.

14. The electronic device according to claim 13, wherein the conductive heat dissipating portion includes:
   a heat dissipating member having a heat dissipating layer of a metal material, and attached to the shield member;
   a cushion member combined with the heat dissipating member; and
   an adhesion member combined with the cushion member and combined with the rear surface of the flexible display panel.

15. The electronic device according to claim 14, wherein the flexible circuit board includes at least one ground pad, and
wherein the shield member electrically connects the at least one ground pad with the heat dissipating member.

16. The electronic device according to claim 15, wherein the shield member includes a shield portion configured to cover the display pad portion, the driving integrated circuit, and some of the flexible circuit board, and configured to support the shock absorbing portion, and
wherein the shield portion includes:
   a conductive tape configured to cover the display pad portion, the driving integrated circuit, and some of the flexible circuit board, and attached to the heat dissipating member and the at least one ground pad; and
   an insulating tape combined with the conductive tape overlapped with each of the display pad portion, the driving integrated circuit, and some of the flexible circuit board.

17. The electronic device according to claim 16, wherein the flexible display module further includes a heat insulation tape disposed in at least one of one surface of the panel flexible circuit film overlapped with the driving integrated circuit and disposed to confront the conductive heat dissipating portion, and one surface of the flexible circuit board confronting the conductive heat dissipating portion.

18. The electronic device according to claim 15, wherein the flexible display module further includes a heat insulation tape disposed in at least one of one surface of the panel flexible circuit film overlapped with the driving integrated circuit and disposed to confront the conductive heat dissipating portion, and one surface of the flexible circuit board confronting the conductive heat dissipating portion.

19. The electronic device according to claim 14, wherein the flexible display module further includes a heat insulation tape disposed in at least one of one surface of the panel flexible circuit film overlapped with the driving integrated circuit and disposed to confront the conductive heat dissipating portion, and one surface of the flexible circuit board confronting the conductive heat dissipating portion.

20. The electronic device according to claim 13, wherein the flexible display module further includes a heat insulation tape disposed in at least one of one surface of the panel flexible circuit film overlapped with the driving integrated circuit and disposed to confront the conductive heat dissipating portion, and one surface of the flexible circuit board confronting the conductive heat dissipating portion.

* * * * *